(12) United States Patent
Lin et al.

(10) Patent No.: US 7,851,774 B2
(45) Date of Patent: Dec. 14, 2010

(54) SYSTEM AND METHOD FOR DIRECT WRITING TO A WAFER

(75) Inventors: Burn Jeng Lin, Hsin-Chu (TW); Jeng-Horng Chen, Hsin-Chu (TW); Shy-Jay Lin, Hsinchu County (TW); Tsai-Sheng Gau, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 177 days.

(21) Appl. No.: 12/203,494

(22) Filed: Sep. 3, 2008

(65) Prior Publication Data

US 2009/0268184 A1    Oct. 29, 2009

Related U.S. Application Data

(60) Provisional application No. 61/047,931, filed on Apr. 25, 2008.

(51) Int. Cl.
    *H01J 49/44* (2006.01)
(52) U.S. Cl. .............. 250/492.22; 250/492.2; 250/492.23; 250/494.1; 250/396 R; 355/67
(58) Field of Classification Search ................ None
    See application file for complete search history.

(56) References Cited

U.S. PATENT DOCUMENTS

| | | | |
|---|---|---|---|
| 6,897,458 B2* | 5/2005 | Wieland et al. ......... 250/494.1 |
| 6,919,952 B2* | 7/2005 | Kruit ..................... 355/67 |
| 6,958,804 B2* | 10/2005 | Wieland et al. .......... 355/67 |
| 7,019,312 B2* | 3/2006 | Kruit ..................... 250/492.2 |
| 7,019,908 B2* | 3/2006 | van 't Spijker et al. .... 359/619 |
| 7,084,414 B2* | 8/2006 | Wieland et al. ......... 250/492.23 |
| 7,091,504 B2* | 8/2006 | Wieland et al. .......... 250/494.1 |
| 7,129,502 B2* | 10/2006 | Kruit ..................... 250/396 R |
| 7,173,263 B2* | 2/2007 | Wieland et al. ......... 250/492.22 |
| 7,314,689 B2* | 1/2008 | Lin et al. ................. 430/5 |
| 7,348,567 B1* | 3/2008 | Kruit ..................... 250/396 R |
| 7,365,338 B2* | 4/2008 | Kruit ..................... 250/396 R |
| 2009/0268184 A1* | 10/2009 | Lin et al. ................. 355/67 |

FOREIGN PATENT DOCUMENTS

| | | |
|---|---|---|
| CN | 1575439 | 2/2005 |
| CN | 201035320 | 3/2008 |

OTHER PUBLICATIONS

"Mapper Lithography," printed from www.mapperlithography.com/technology-mapper.html on Sep. 3, 2008, 1 page, date unknown.
Chinese Patent Office, Office Action of Apr. 13, 2010, Application No. 200910136076.6, 8 pages.

* cited by examiner

*Primary Examiner*—David A Vanore
(74) *Attorney, Agent, or Firm*—Haynes and Boone, LLP

(57) ABSTRACT

A direct-write (DW) exposure system is provided which includes a stage for holding a substrate and configured to scan the substrate along an axis during exposure, a data processing module for processing pattering data and generating instructions associated with the patterning data, and an exposure module that includes a plurality of beams that are focused onto the substrate such that the beams cover a width that is larger than a width of a field size and a beam controller that controls the plurality of beams in accordance with the instructions as the substrate is scanned along the axis. The widths are in a direction different from the axis.

20 Claims, 12 Drawing Sheets

SYSTEM AND METHOD FOR DIRECT WRITING TO A WAFER

PRIORITY DATA

This application claims priority to Provisional Application Ser. No. 61/047,931, filed on Apr. 25, 2008, entitled "SYSTEM AND METHOD FOR DIRECT WRITING TO A WAFER", the entire disclosure of which is incorporated herein by reference.

BACKGROUND

The present disclosure relates generally to semiconductor manufacturing and, more particularly, to a system and method for direct writing to a wafer.

Photolithography or optical lithography is generally known as a process that is used in micro fabrication to selectively remove parts of thin films on a substrate. Photolithography generally uses a directed light source to transfer a geometric pattern from a photomask to a light-sensitive chemical resist material that is formed on the substrate, thus generating an exposure pattern in the resist material from the light radiation. A series of chemical treatments may then be used to etch or otherwise transfer the exposure pattern into one or more thin film layers positioned underneath the resist layer.

More recent lithography-type systems for micro fabrication operate to transfer or generate an exposure pattern in a resist layer without the intermediary step of creating a photomask. For example, a direct-write (DW) exposure tool operates to write patterns directly into one or more layers on a substrate (without a photomask or reticle). The pattern is generally written from an electronic or computer-type file that is used to control a precision exposure source that may be selectively directed onto the layers of the substrate. More particularly, a DW exposure tool is generally configured such that the exposure of a circuit pattern is made not by illumination of the photo-resist through a mask or film negative of the circuit, but rather by directly and selectively exposing the desired areas of the resist or other layer on a substrate with a focused beam of the appropriate energy and dosage to create the desired circuit pattern. However, the DW exposure tool is expensive to own and operate, and exposing an entire wafer is time consuming. Accordingly, wafer throughput is low as compared to photolithography or other projection imaging systems.

Therefore, a need exists for a system and method for direct writing to a wafer that increases wafer throughput.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to semiconductor manufacturing and more particularly, to a system and method for writing directly to a wafer. It is understood, however, that specific embodiments are provided as examples to teach the broader inventive concept, and one of ordinary skill in the art can easily apply the teaching of the present disclosure to other methods or devices. In addition, it is understood that the methods and system discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings.

Figure 1:
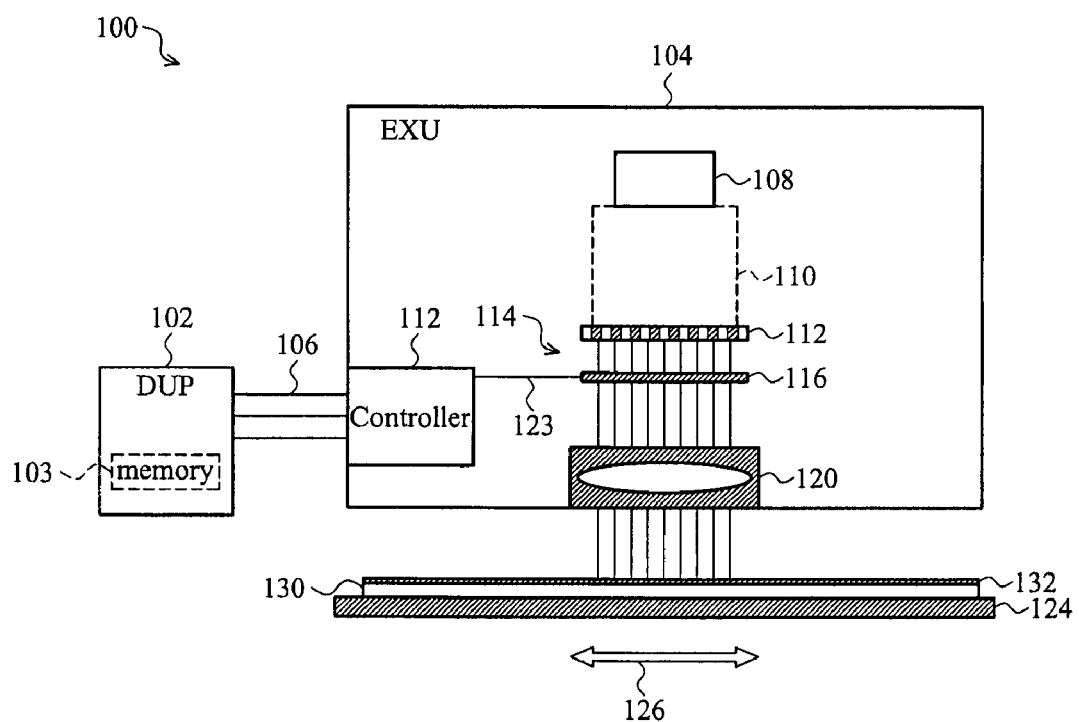
FIG. 1 is a diagrammatic view of a direct-write (DW) system accordingly to various aspects of the present disclosure.

Referring to FIG. 1, illustrated is a diagrammatic view of an exemplary direct-write (DW) system 100. The DW system 100 includes a data processing unit 102 (DPU) and an exposure unit 104 (EXU). The DPU 102 (DPU) is configured to read patterning data from a data storage medium, which may be within the DPU 102 or remotely positioned and in communication with the DPU 102. The DPU 102 obtains the patterning data and loads it into its memory 103. The DPU 102 processes the patterning data and generates a pattern writing instruction set, and sends the writing instruction set to the EXU 104. Depending on the form of the stored patterning data, when the patterning data includes an EXU writing instruction, the function of the DPU is reading, loading, and sending, as noted above. However, when the stored pattern data is a raw GDS-type file from a circuit designer, then the DPU 102 may also perform proximity correction and transformation to the writing instruction instructions for the EXU 104. Alternatively, the proximity correction and transformation may optionally be performed separately by a standalone module. The writing instruction set are preferably sent on one or more optical fibers 106 using light radiation as carriers of the information as will be discussed later herein. The high bandwidth associated with the optical fibers 106 supports high data transmission rates, and is well suited to transfer the large quantity of data from the DPU 102 to the EXU 104 at a sufficient rate in order to write the patterning data properly.

The EXU 104 includes a source 108 that is configured to generate at least one energized beam 110, such as a photon beam, electron beam, or ion beam. The beam 110 may pass through one or more lenses (not shown) and may be focused to a beam aperture portion 112. The beam aperture portion 112 is configured with a plurality of apertures or openings that split the beam 110 into a plurality of beams 114. The number of beams 114 may vary depending on the design requirements of the DW system 100 as will be discussed later herein. The plurality of beams 114 may travel to a beam controller 116 that is configured to allow one or more of the beams to pass through to an imaging head 120, or to block/blank one or more of the beams 114 from passing through to the imaging head. The imaging head 120 includes an electron optical system for focusing the beams that are allowed to pass through. The beam controller 116 may include a plurality of deflectors that are controlled by electrical control signals that are associated with the writing instructions sent from the DPU 102. When the deflector is not energized, the corresponding beam is allowed to pass through to the imaging head 120. When the deflector is energized, an electrical field is generated that deflects the corresponding beam such that the beam is blocked from passing through to the imaging head 120.

The EXU 104 may further include a controller 122 that receives the writing instructions from the DPU 102 via the optical fibers 106. The writing instructions are sent using light radiation as carriers of the information. Accordingly, the controller 122 includes a plurality of light-to-electrical converters, such as photodiodes, that convert the light signals (e.g., writing instructions) into electrical control signals which are used to control 123 the deflectors of the beam controller 116 as discussed above. The DW system 100 further includes a stage 124 that is configured to move 126 in various directions. The stage 124 may hold and secure a wafer 130 by a vacuum system or other suitable securing mechanism. The wafer 130 may include a semiconductor substrate, a mask blank, a glass substrate, and a flat panel substrate. The wafer 130 includes a recording medium 132, such as a photoresist, formed thereon. During processing, the wafer 130 is moved or scanned relative to the imaging head 120 and in cooperation with the controller 122. The beams 114 that pass through to the imaging head 120 are focused, by the electron optical system, onto the recording medium 132 such that the desired pattern is written directly into the recording medium (without a photomask or reticle). After the entire wafer 130 has been scanned, the recording medium 132 is developed to form the pattern over the wafer 130, and other processing, such as etching and doping, may be performed using the patterned recording medium. It is understood that the DW system 100 may include other components such as an alignment system and collimator, but is simplified for a better understanding of the disclosed embodiments herein.

Figure 2:
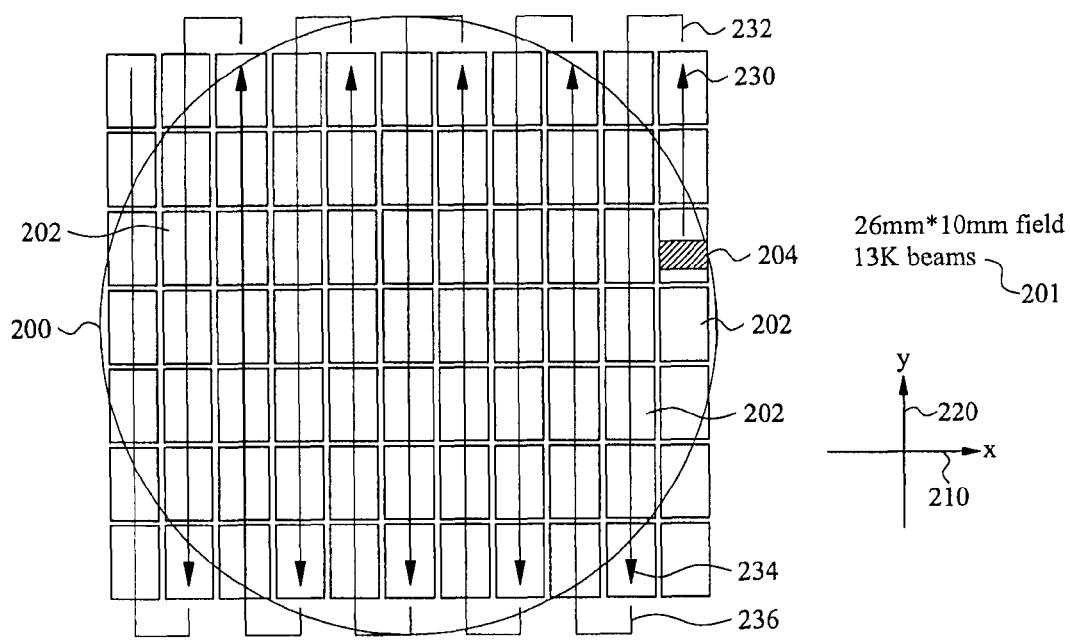
FIG. 2 is a top view of a wafer being scanned by a DW system having a plurality of beams that covers the width of a field size, the field size being a maximum exposure area that a lens can properly project an image from a photomask to the wafer in a projection imaging system.

Referring to FIG. 2, illustrated is a top view of a wafer 200 being scanned with a DW system having a plurality of beams 201 configured to write a field size 202. For example, a DW system from MAPPER Lithography, The Netherlands has demonstrated parallel electron beam writing of the field size 202. The DW system is similar to the DW system 100 of FIG. 1 except for the features described below. The field size 202 is substantially the same as a maximum exposure area that a lens can properly (sufficient resolution) project an image from a photomask or reticle to a wafer in a projection imaging system or photolithography system (e.g., step-and-repeat tools and step-and-scan tools) for various technologies such as 130 nm process, 90 nm process, 65 nm process and beyond. In the present example, the maximum exposure area may include a field size of 26 mm by 40 mm. The field size 202 may include at least one die that is repeated over the entire wafer 200. It is preferred to assemble as many chips (e.g., independently functioning circuits) into the die to minimize the steps required to expose the entire wafer, and thus maximize the wafer throughput. Also, the field size 202 may represent a limited field size of a projection imaging system to expose less critical layers that the DW systems have to match when exposing critical layers.

The plurality of beams 201 may include 13 k beams that are spaced 200 um apart, and may be confined within an exposure area 204 of 26 mm by 10 mm. Accordingly, the exposure area 204 may be sufficient to directly write the field size 202 of 26 mm by 40 mm as the wafer 200 is scanned in one direction. As discussed above, the wafer 200 may be secured to a stage (not shown) that is similar to the stage 124 of FIG. 1. The stage is configured to move in an x-direction 210 and a y-direction 220 so that the entire wafer 200 can be scanned and directly written to by the plurality of beams 201. For example, the wafer 200 (via the stage) is moved in a direction 230 along the y-direction 220, and the writing instructions control the plurality of beams 201 to write the desired pattern to the field size 202. The writing instructions are repeated as the exposure area 204 moves to the next field size 202 and so forth. When the exposure area 204 approaches an edge of the wafer 200, the stage continues to move such that the exposure area 204 goes beyond the wafer edge at a sufficient distance to facilitate a change in direction 232. The wafer 200 is then moved in an opposite direction 234 along the y-direction 220 during exposure until the exposure area 204 again reaches the wafer edge. However, the writing instructions are reversed since the desired pattern is written in the opposite direction 234 as compared to direction 230. The wafer 200 continues to move such that the exposure area 204 goes beyond the wafer edge to again facilitate a change in direction 236. The DW system repeats this process to write the desired pattern for each field size 202 on the wafer 200.

There are disadvantages with the scanning configuration discussed above in FIG. 2. One disadvantage is that the stage is accelerated and decelerated many times in the x-direction 210 and y-direction 220 during the exposure of the entire wafer 200. That is, each time the stage changes direction it is accelerated and decelerated. For example, the stage may turn-around 10 times and may accelerate/decelerate 11 times to fully expose a 300 mm wafer. Accordingly, this scanning configuration is time-consuming, and thus results in low wafer throughput. Another disadvantage is that the exposure/pattern data must be reversed when the stage changes direction. That is, the exposure data when the wafer is being scanned in one direction is different when the wafer is being scanned in the opposite direction. Accordingly, more data handling capacity may be required in the DPU 102. Yet another disadvantage is that when the die size is smaller than the field size 202 (e.g., 20 mm instead of 26 mm), part of the beams may have to be turned off which may further reduce wafer throughput. Therefore, what is needed is a system and method for direct writing to a wafer that addresses the concerns discussed above and increases wafer throughput as will be discussed below in FIGS. 3-12.

Figure 3:
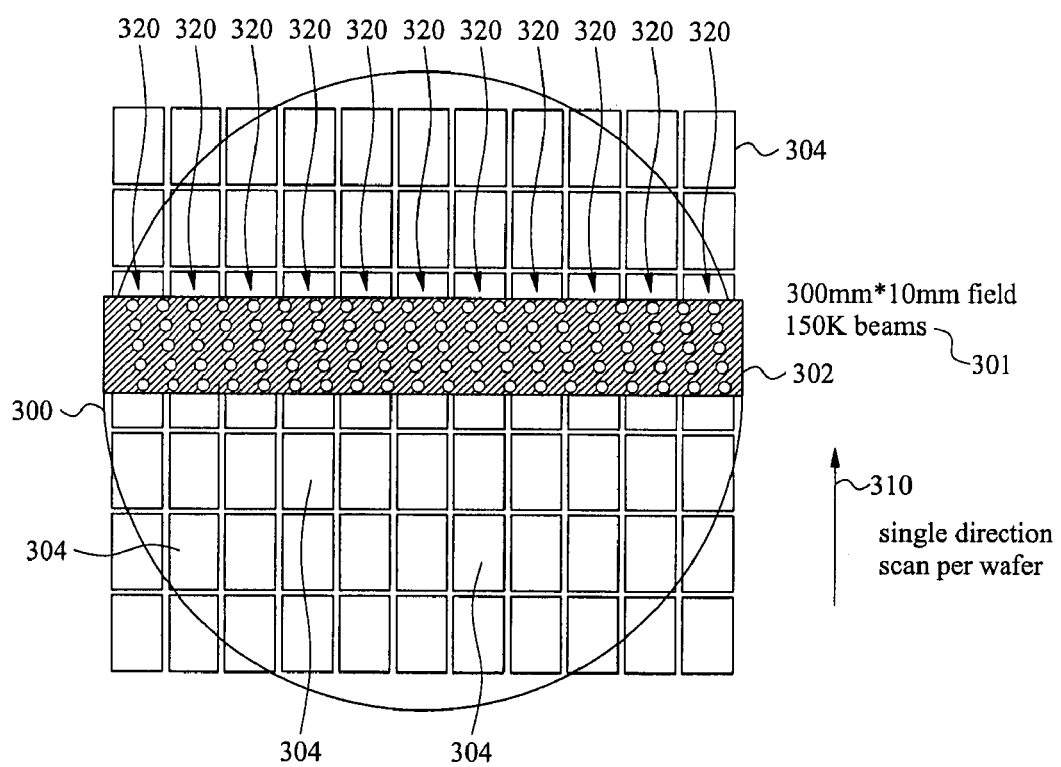
FIG. 3 is a top view of a wafer being processed by an alternative DW system having a plurality of beams that covers the width of the wafer.

Referring to FIG. 3, illustrated is a top view of a wafer 300 being scanned with a DW system having a plurality of beams 301 configured to cover an entire width of the wafer 300 according to various aspects of the present disclosure. The DW system is similar to the DW system 100 of FIG. 1 except for the features described below. The plurality of beams 301 may include 150 k beams that are spaced 200 um apart, and may be confined to cover an exposure area 302 of 300 mm by 10 mm. Accordingly, the exposure area 302 may be sufficient to directly write a field size 304 of any dimension on the wafer 300 as the wafer is being scanned. In the present example, the field size 304 may be 26 mm by 40 mm (the same as in FIG. 2). The wafer 300 (via the stage 124 of FIG. 1) is scanned in one direction 310 to expose the entire wafer.

The plurality of beams 301 may be arranged in a manner such that an array of beams 320 may be used to write the desired pattern to each field size 304 as the wafer 300 is scanned in one direction 310. The writing instructions for each field size 304 will be same, and thus the inter-field data is sent in parallel to all the fields from one set of writing instructions. Also, the optical fibers carrying the writing instructions may shared between the fields as will be discussed later herein. Further, all the beams 301 may be used regardless of the die size as will also be discussed later herein. The wafer throughput is greatly improved in the present embodiment as compared to the configuration of FIG. 2. The wafer 300 is scanned in one direction 310 to expose the entire wafer, there is no turn-around time for the stage, and there is one time of acceleration/deceleration of the stage. Also, the writing instructions do not need to be reversed, and thus reduces the handling capacity requirements of the DPU. Further, when the beams on one die are used, the data transmission rates per beam is taxing, and thus increasing the number of beams relaxes the data rate requirements.

Figure 4:
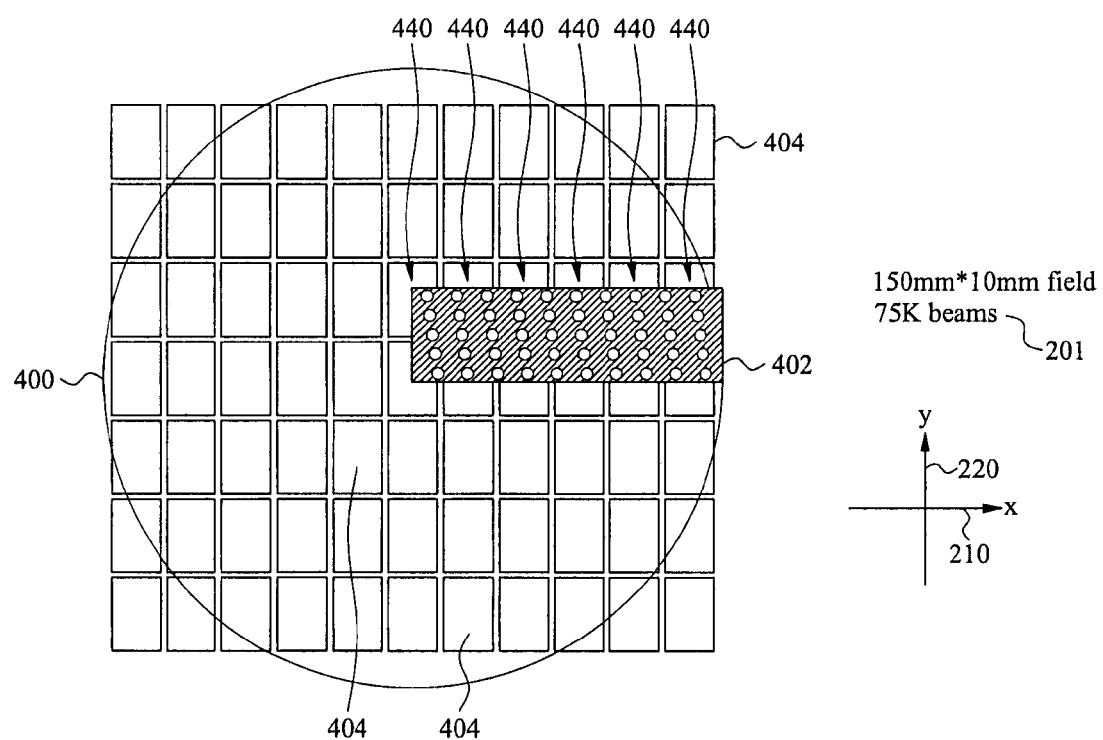
FIG. 4 is a top view of a wafer being scanned by an alternative DW system having a plurality of beams that covers one-half of the width of the wafer.

Referring to FIG. 4, illustrated is a top view of a wafer 400 being scanned with a DW system having a plurality of beams 401 configured to cover about one-half of the width of the wafer 400. The DW system is similar to the DW system 100 of FIG. 1 except for the features described below. The plurality of beams 401 may include 75 k beams that are spaced 200 um apart, and may be confined to cover an exposure area 402 of 150 mm by 10 mm. Accordingly, the exposure area 402 may be sufficient to directly write to a field size 304 with a width of up to 150 mm. The width is in the direction opposite the scanning direction. In the present example, the field size 404 may be 26 mm by 40 mm (the same as in FIG. 2). The wafer 400 (via the stage 124 of FIG. 1) is moved in an x-direction 410 and a y-direction 420 to expose the entire wafer.

The plurality of beams 401 may be arranged in a manner such that an array of beams 440 may be used to write the desired pattern to each field size 404 as the wafer 300 is scanned along the y-direction 420. The writing instructions for each field size 404 will be same, and thus the inter-field data is sent in parallel to all the fields from one set of writing instructions. Also, the optical fibers carrying the writing instructions may shared between the fields as will be discussed later herein. The writing instructions may be reversed when the wafer 400 is moved in opposite directions (e.g., up and down) along the y-direction 420. Further, all the beams 401 may be used regardless of the die size as will be discussed later herein. The wafer throughput is greatly improved in the present embodiment as compared to the configuration of FIG. 2. There is less column scanning, less turn-around times for the stage, and less acceleration/deceleration of the stage.

Although the plurality of beams 401 of are configured to cover about one-half of the width of the wafer, it is understood that the plurality of beams 401 may optionally cover at least twice the field size 202 of FIG. 2. That is, twice a maximum exposure area that a lens can properly project an image from a photomask or reticle to a wafer in a photolithography system or other projection imaging system. Accordingly, the flexibility of the die size (e.g., equal to or smaller than the field size), reduction of direction and scanning velocity can be effectively achieved in the DW system of FIGS. 3 and 4, and thus wafer throughput is increased.

Figure 5:
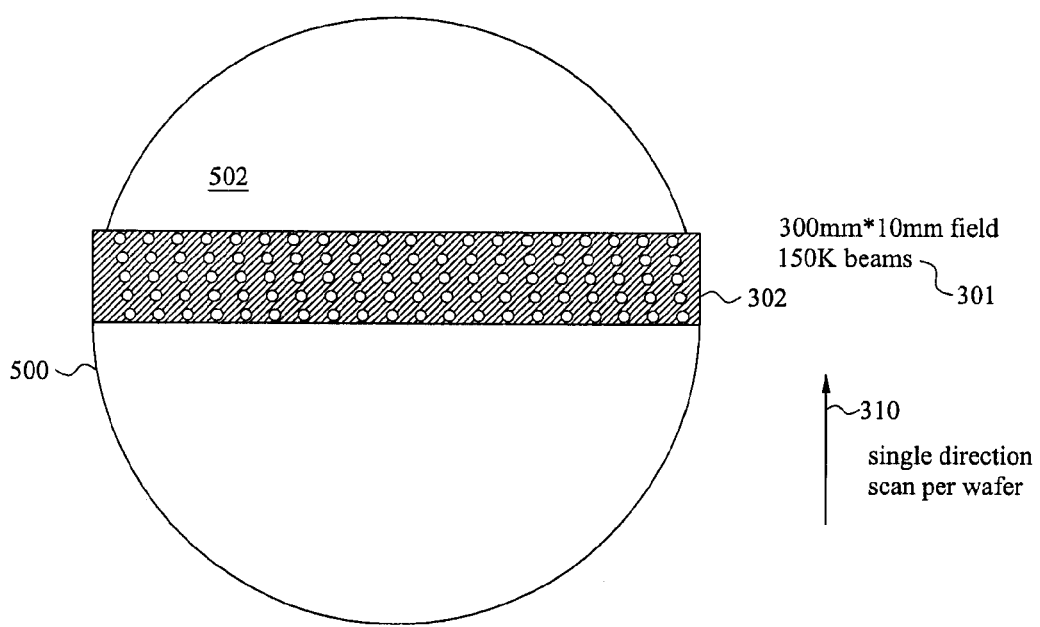
FIG. 5 is a top view of a wafer being scanned to write a full field size.

Referring to FIG. 5, illustrated is a top view of a wafer 500 being scanned to write a full field size 502. Similar features in FIGS. 3 and 5 are numbered the same for clarity. As discussed above in FIG. 3, the plurality of beams 301 may include 150 k beams that are spaced 200 um apart, and may be confined to cover an exposure area 302 of 300 mm by 10 mm. Accordingly, the wafer 500 (via the stage 124 of FIG. 1) is scanned in one direction 310 to write the full field size 502 that substantially covers the entire wafer. In the present embodiment, the full field size 502 may be used in various applications such as an image sensor for astronomy telescopes, and may be used without the stitching from a plurality of small size image sensors. It is understood that the number of beams and the spacing of the beams may be varied depending on the design requirements of the DW system and the size of the pattern features for a particular application. For example, the plurality of beams may include 75 k beams, and may be confined to cover an exposure area of 300 mm by 10 mm.

Figure 6:
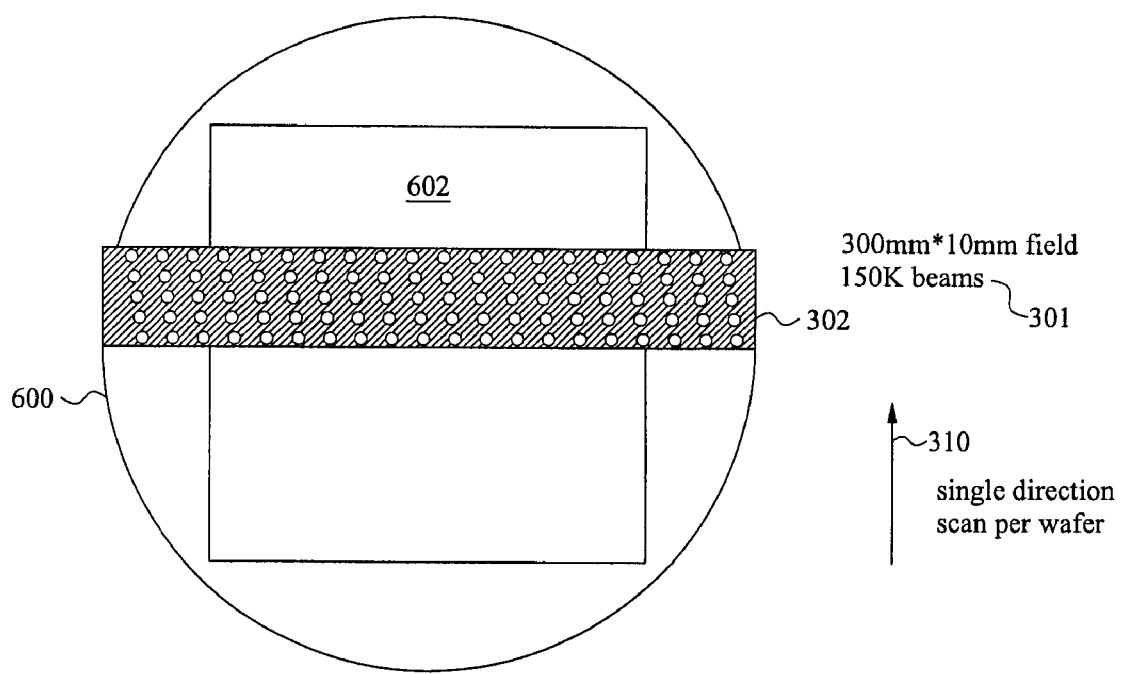
FIG. 6 is a top view of a wafer being scanned to write a single field size.

Referring to FIG. 6, illustrated is a top view of a wafer 600 being scanned to write a single field size 602. Similar features in FIGS. 3 and 6 are numbered the same for clarity. As discussed above in FIG. 3, the plurality of beams 301 may include 150 k beams that are spaced 200 um apart, and may be confined to cover an exposure area 302 of 300 mm by 10 mm. Accordingly, the wafer 600 (via the stage 124 of FIG. 1) is scanned in one direction 310 to write the single field size 602 on the entire wafer. In the present embodiment, the single field size 602 may be used, for example, in non-stitching large scale image sensor applications. It is understood that the number of beams and the spacing of the beams may be varied depending on the design requirements of the DW system and the size of the pattern features for a particular application. For example, the plurality of beams may include 75 k beams, and may be configured to cover an exposure area of 300 mm by 10 mm.

Figure 7:
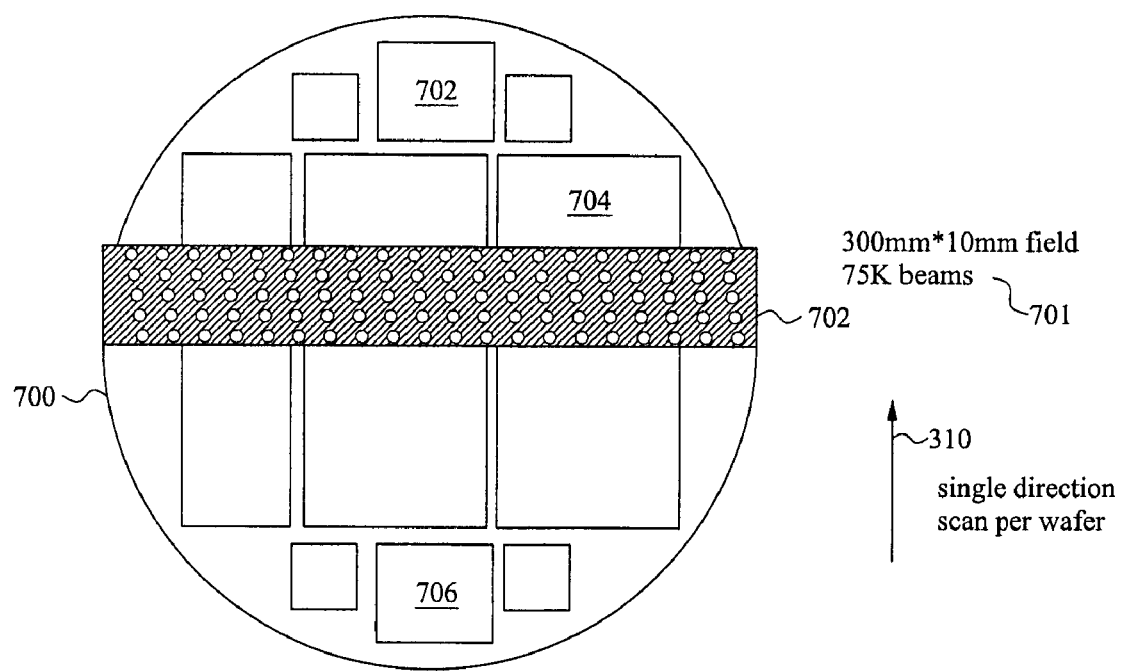
FIG. 7 is a top view of a wafer being scanned to write a plurality of field sizes with different configurations.

Referring to FIG. 7, illustrated is a top view of a wafer 700 being scanned to write a plurality of field sizes of different configurations. Similar features in FIGS. 3 and 7 are numbered the same for clarity. A plurality of beams 701 may include 75 k beams, and may be confined to cover an exposure area 702 of 300 mm by 10 mm. Accordingly, the wafer 700 (via the stage 124 of FIG. 1) is scanned in one direction 310 to write the plurality of field sizes 702, 704, 706 on the wafer. In the present embodiment, the field sizes 702, 704, 706 may include different die sizes that are used for different image sensor designs in digital camera applications. For example, the field size 702 may include a die size of 60 mm by 60 mm for an image sensor design. The field size 704 may also include a die size of 100 mm by 150 mm for another image sensor design. Further, the field size 706 may include a die size of 90 mm by 60 mm for yet another image sensor design. It is understood that the number of beams and the spacing of the beams may be varied depending on the design requirements of the DW system and the size of the pattern features for a particular application.

Figure 8:
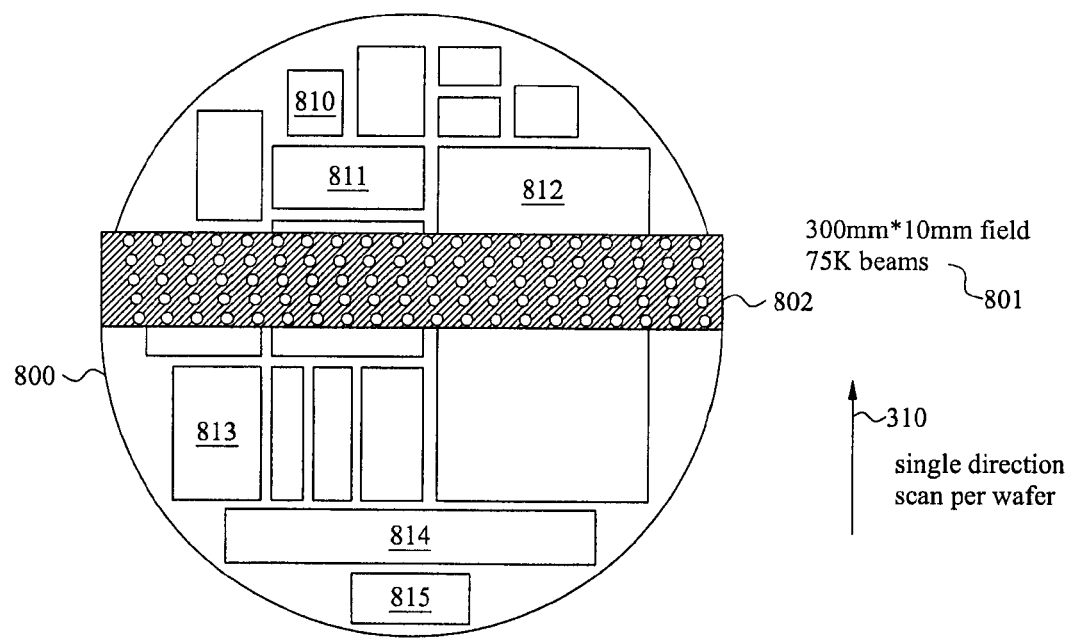
FIG. 8 is a top view of a wafer being scanned to write a plurality of field sizes with different configurations.

Referring to FIG. 8, illustrated is a top view of a wafer 800 being scanned to write a plurality of field sizes of different configurations. Similar features in FIGS. 3 and 8 are numbered the same for clarity. A plurality of beams 801 may include 75 k beams, and may be confined to cover an exposure area 802 of 300 mm by 10 mm. Accordingly, the wafer 800 (via the stage 124 of FIG. 1) is scanned in one direction 310 to write a plurality of field sizes 810-815 on the wafer. In the present embodiment, the field sizes 810-815 may have different die sizes that may be required to meet the design requirements of different customers. Further, the multiple field sizes 810-815 of various configurations provides flexibility according to the market demand for various consumer products. It is understood that the number of beams and the spacing of the beams may be varied depending on the design requirements of the DW system and the size of the pattern features for a particular application.

It is understood that in the embodiments described in FIGS. 1-8, the patterning data that is used to directly write to the wafer remains the same since the die size is not allowed to exceed the field size of current projection imaging systems. The embodiments disclosed in FIGS. 3-8 use a large number of beams. The beam aperture portion 116 and imaging electron optics of FIG. 1 are MEMS (microelectromechanical systems) based, and thus the number of beams can be increased by using a larger substrate to fabricate these structures. However, it is very costly to expand the data path to support the large increase in the number of beams. Accordingly, the DW system uses multiple (but identical) writing instructions that are sent in parallel to all the die locations for writing. As previously discussed, a plurality of optical fibers may be used to carry the writing instructions from the DPU to the EXU. However, if each optical fiber is dedicated to one beam, there would be an enormous number of optical fiber cables (e.g., 150 k and 75 k) to manage and route, and it would be impractical and expensive to implement such a configuration with the EXU. Since the inter-field writing instructions (e.g., beam blanking instructions) are the same for all the fields, the writing instructions may be carried in singles instead of multiples. The writing instructions are sent in parallel to all the fields from one set of writing instructions.

Figure 9:
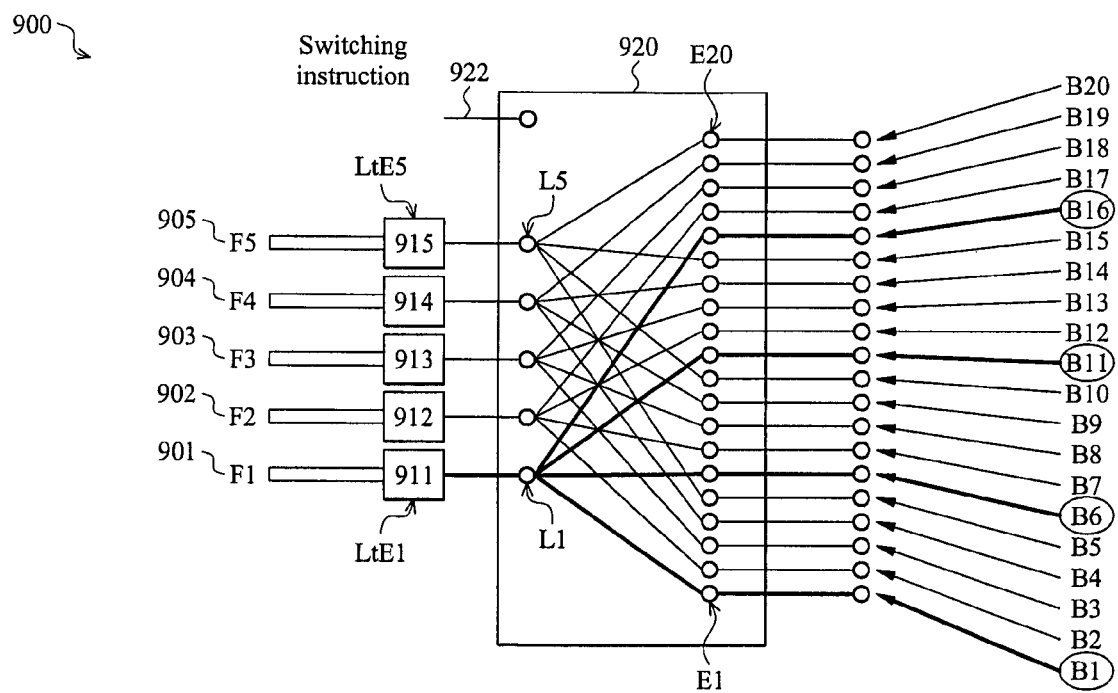
FIG. 9 is a schematic view of a fiber-to-electrical coupling configuration for transmitting writing instructions from a data processing unit (DPU) to an exposure unit (EXU) with five fibers to twenty beams.

Referring to FIG. 9, illustrated is a schematic view of a light-to-electric coupling configuration 900 for transmitting writing instructions from a data processing unit (DPU) to an exposure unit (EXU) that may be implemented in the direct write (DW) systems of FIGS. 1-8. As previously discussed, the DPU processes the patterning data and generates a pattern writing instruction set, and sends the writing instruction set to the EXU. The writing instructions are preferably sent on one or more optical fibers using light radiation as carriers of the information. In the present example, the configuration 900 includes five (5) optical fibers 901-905 (F1-F5) that are used to control twenty (20) beams B1-B20. The optical fibers 901-905 carry intra-field writing instructions to a corresponding light-to-electric converter 911-915 (LtE1-LtE5). The light-to-electric converters 911-915 may be photodiodes, image sensors, or other suitable devices that convert light signals into electrical signals. The electrical signals may be sent to inputs L1-L5 of a switching circuit 920. The light-to-electric converters 911-915 and the switching circuit 920 may be part of the controller 122 of FIG. 1.

The switching circuit 920 may be controlled by a switching instruction signal 922, and the inputs L1-L5 command the information to be distributed, via outputs E1-E20, to beam inputs B1-B20. The outputs E1-E20 of the switching circuit 920 are coupled to beam inputs B1-B20 that switch "on" (not-blank) and "off" (blank) the corresponding beams according to the writing instructions. Accordingly, the electrical signal provided at L1 is distributed to outputs E1, E6, E11, and E16 which are coupled to beams B1, B6, B11, and B16, respectively. The electrical signal provided at L2 is distributed to outputs E2, E7, E12, and E17 which are coupled to beams B2, B7, B12, and B17, respectively. The electrical signal provided at L3 is distributed to outputs E3, E8, E13, and E18 which are coupled to beams B3, B8, B13, and B18, respectively. The electrical signal provided at L4 is distributed to outputs E4, E9, E14, and E19 which are coupled to beams B4, B9, B14, and B19, respectively. The electrical signal provided at L5 is distributed to outputs E5, E10, E15, and E20 which are coupled to beams B5, B10, B15, and B20, respectively.

Figure 10:
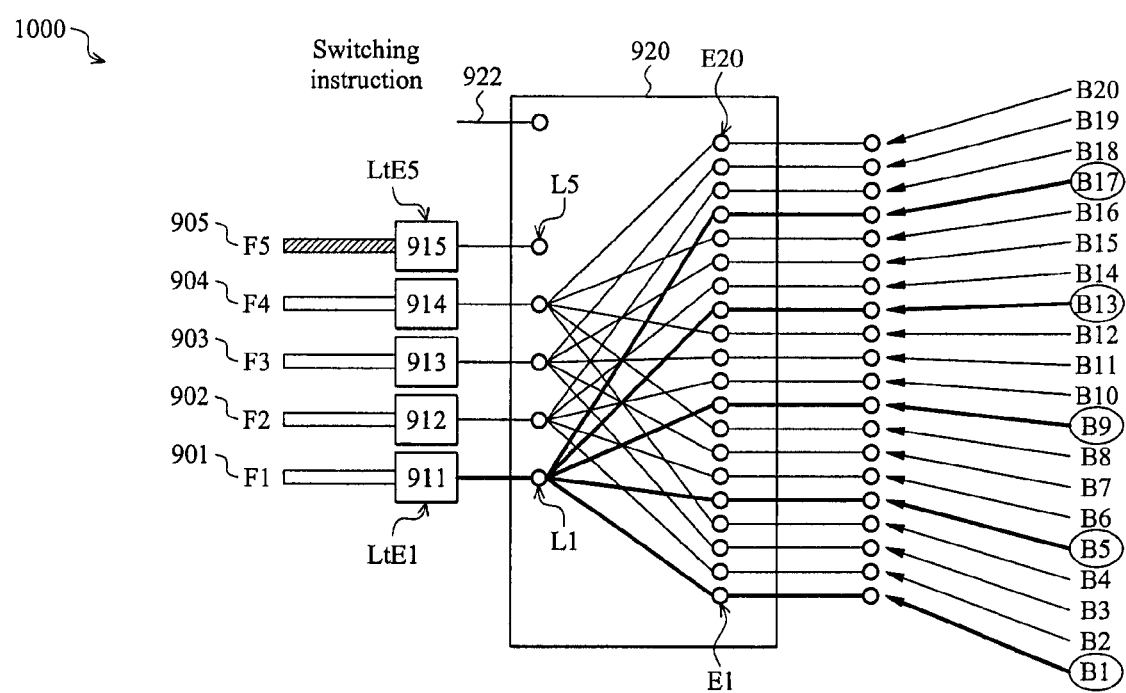
FIG. 10 is a schematic view of a fiber-to-electrical coupling configuration for transmitting writing instructions from a data processing unit (DPU) to an exposure unit (EXU) with four fibers to twenty beams.

Referring to FIG. 10, illustrated is a schematic view of a light-to-electrical coupling configuration 1000 for transmitting writing instructions from a DPU to an EXU that may be implemented in the DW systems of FIGS. 3-8. The configuration 1000 is similar to the configuration 900 of FIG. 9 except for the features described below. Similar features in FIGS. 9 and 10 are numbered the same for clarity. In the present example, the five optical fibers 901-905 (F1-F5) are used to cover the largest exposure area that the DW system can write as the wafer is scanned. In the situation where four (4) fibers 901-904 are used to write a pattern that is smaller than the largest exposure area. In other words, the die calls for a smaller field size that requires four (4) fibers 901-904 instead of five (5) fibers 901-905. Accordingly, the four (4) optical fibers 901-904 (F1-F4) may be used to control twenty (20) beams B1-B20. The optical fibers 901-904 carry intra-field writing instructions to a corresponding light-to-electric converter 911-914 (LtE1-LtE4). The light-to-electric converters 911-914 may be photodiodes or other suitable devices that convert light signals into electrical signals. The electrical signals may be sent to inputs L1-L4 of a switching circuit 920.

The switching circuit 920 may be controlled by a switching instruction signal 922, and the inputs L1-L4 command the information to be distributed, via outputs E1-E20, to beam inputs B1-B20. The outputs E1-E20 of the switching circuit 920 are coupled to beam inputs B1-B20 that switch "on" (not-blank) and "off" (blank) the corresponding beams according to the writing instructions. Accordingly, the electrical signal provided at L1 is distributed to outputs E1, E5, E9, E13, and E17 which are coupled to beams B1, B5, B9, B13, and B17, respectively. The electrical signal provided at L2 is distributed to outputs E2, E6, E10, E14, and E18 which are coupled to beams B2, B6, B10, B14, and B18, respectively. The electrical signal provided at L3 is distributed to outputs E3, E7, E11, E15, and E18 which are coupled to beams B3, B7, B11, B15, and B19, respectively. The electrical signal provided at L4 is distributed to outputs E4, E8, E12, E16, and E20 which are coupled to beams B4, B8, B12, B16, and B20, respectively.

Figure 11:
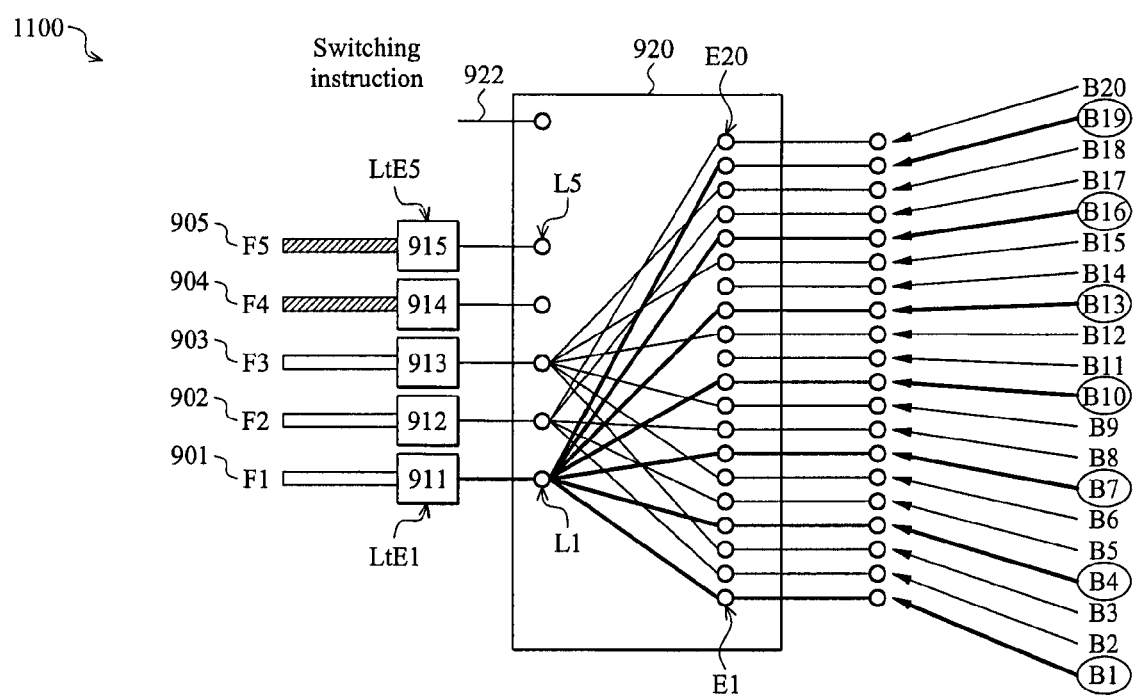
FIG. 11 is a schematic view of a fiber-to-electrical coupling configuration for transmitting writing instructions from a data processing unit (DPU) to an exposure unit (EXU) with three fibers to twenty beams.

Referring to FIG. 11, illustrated is a schematic view of a schematic view of a configuration 1100 for transmitting writing instructions from a DPU to an EXU that may be implemented in the DW systems of FIGS. 3-8. The configuration 1100 is similar to the configuration 900 of FIG. 9 except for the features described below. Similar features in FIGS. 9 and II are numbered the same for clarity. FIG. 11 illustrates the situation where the number of beams is not an integer multiple of the number of optical fibers (e.g., 3 fibers to control 20 beams). In the present example, the five optical fibers 901-905 (F1-F5) are used to cover the largest exposure area that the DW system can write to. In the situation where three (3) fibers 901-903 are used to write a pattern that is smaller than the largest exposure area. In other words, the die calls for a smaller field size that requires three (3) fibers 901-903 instead of five (5) fibers 901-905. Accordingly, the three (3) optical fibers 901-903 (F1-F3) may be used to control twenty (20)

beams B1-B20. The optical fibers 901-903 carry intrafield writing instructions to a corresponding light-to-electric converter 911-913 (LtE1-LtE4). The light-to-electric converters 911-913 may be photodiodes or other suitable devices that convert light signals into electrical signals. The electrical signals may be sent to inputs L1-L3 of a switching circuit 920.

The switching circuit 920 may be controlled by a switching instruction signal 922, and the inputs L1-L3 command the information to be distributed, via outputs E1-E20, to beam inputs B1-B20. The outputs E1-E20 of the switching circuit 920 are coupled to beam inputs B1-B20 that switch "on" (not-blank) and "off" (blank) the corresponding beams according to the writing instructions. Accordingly, the electrical signal provided at L1 is distributed to outputs E1, E4, E7, E10, E13, E16, and E19 which are coupled to beams B1, B4, B7, B10, B13, B16, and B19, respectively. Similarly, the electrical signal provided at L2 is distributed to outputs E2, E5, E8, E11, E14, E17, and E20 which are coupled to beams B2, B5, B8, B11, B14, B17, and B20, respectively. However, the electrical signal provided at L3 is distributed to outputs E3, E6, E9, E12, E15, and E18 which are coupled to beams B3, B6, B9, B12, B15, and B18, respectively. The exposures with B19 and B20 will not form a full die. These exposures can serve a couple of purposes. The chips (independently functioning circuit) in the partial die can still be functional. If not, the patterns are useful for keeping the patterning density uniform for better patterning lithography, etching, CMP, and other semiconductor processing that may occur after patterning.

Figure 12:
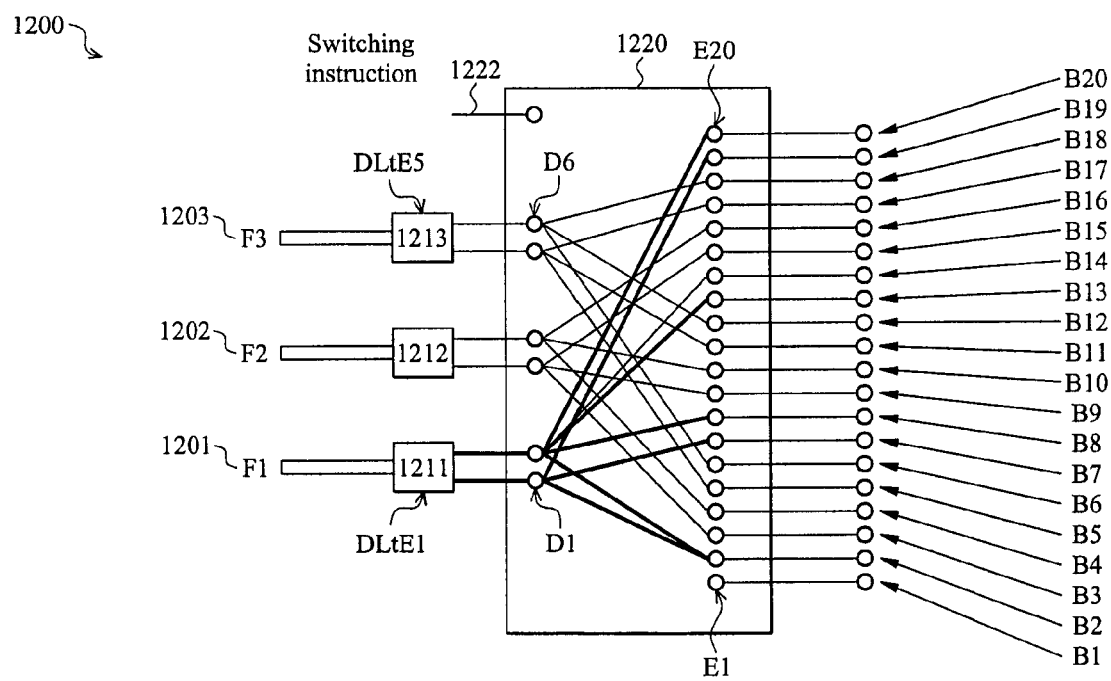
FIG. 12 is a schematic view of a fiber-to-electrical coupling configuration for transmitting writing instructions from a data processing unit (DPU) to an exposure unit (EXU) with fiber decoders.

Referring to FIG. 12, illustrated is a schematic view of a configuration 1200 for transmitting writing instructions from a DPU to an EXU that may be implemented in the DW systems of FIGS. 3-8. The configuration 1200 is similar to the configuration 900 of FIG. 9 except for the features discussed below. Similar features in FIGS. 9 and 12 are numbered the same for clarity. In FIG. 12, the number of optical fibers may further be reduced (as compared to the configuration 900 of FIG. 9) by using encoded transmission to combine the writing instructions (e.g., beam blanking instructions) of many intrafield beams into one optical fiber. In the present example, the configuration 1200 includes three optical fibers 1201-1203 (F1-F3) that carry encoded writing instructions from the DPU to the EXU using light radiation as carriers of the information. The encoded writing instructions may be decoded by decoders 1211-1213 (DLtE1-DLtE2) with light-to-electric signal converters.

The decoded writing instructions are sent to a switching circuit 1220 that controls the plurality of beams. The decoder 1211 outputs decoded instructions to inputs D1 and D2, the decoder 1212 outputs decoded instructions to inputs D3 and D4, and the decoder 1212 outputs decoded instructions to inputs D5 and D6. The switching circuit 1220 may be controlled by a switching instruction signal 1222, and the inputs D1-D6 command the information to be distributed, via outputs E1-E20, to beam inputs B1-B20. The outputs E1-E20 of the switching circuit 1220 are coupled to beam inputs B1-B20 that switch "on" (not-blank) and "off" (blank) the corresponding beams according to the writing instructions. Accordingly, the electrical signal provided at D1 is distributed to outputs E1, E7, E13, and E19 which are coupled to beams B1, B7, B13, and B19, respectively. The electrical signal provided at D2 is distributed to outputs E2, E8, E14, and E20 which are coupled to beams B2, B8, B14, and B20, respectively. However, the electrical signal provided at D3 is distributed to outputs E3, E9, and E15 which are coupled to beams B3, B9, and B15, respectively. The electrical signal provided at D4 is distributed to outputs E4, E10, and E16 which are coupled to beams B4, B10, and B16, respectively. The electrical signal provided at D5 is distributed to outputs E5, E11, and E17 which are coupled to beams B5, B11, and B17, respectively. The electric signal provided at D6 is distributed to outputs E6, E12, and E18.

It is understood that the number of optical fibers and beams described in FIGS. 9-12 may vary depending on the design of the DW system but is simplified for a better understanding of the embodiments disclosed herein. For example, in FIG. 3, the plurality of beams may include 150 k beams that cover an exposure area of 300 mm by 10 mm. In the situation where the field size is 26 mm by 40 mm, the plurality of beams may be configured to simultaneously write 11 field sizes of 26 mm by 40 mm. Further, the beams for each field size will be controlled with the same writing instructions, and thus multiple (but identical) writing instructions will be sent in parallel to all 11 field sizes. Accordingly, the configurations 900, 1000, 1100, 1200 of FIGS. 9-12, respectively, can be implemented to reduce the number of optical fiber cables that are required to operate the 150 k beams in FIG. 3.

Thus, provided is a direct-write (DW) exposure system which includes a stage for holding a substrate and configured to scan the substrate along an axis during exposure, a data processing module for processing patterning data and generating instructions associated with the patterning data, and an exposure module that includes: a plurality of beams that are focused onto the substrate such that the beams cover a width that is larger than a width of a field size of the exposure system, the widths being in a direction different from the axis, and a beam controller that controls the plurality of beams in accordance with the instructions while the substrate is scanned along the axis. In some embodiments, the field size includes a maximum exposure area that a lens can properly project an image from a photomask to the substrate in a projection imaging system. In other embodiments, the width of the field size is about 26 mm. In some other embodiments, the beams substantially cover the width of the substrate. In still other embodiments, the beams cover about one-half of the width of the substrate.

In other embodiments, the plurality of beams are each of a type selected from the group consisting of: an electron beam, an ion beam, and a photon beam. In some embodiments, the substrate includes a recording medium formed thereon. In some other embodiments, the substrate includes a semiconductor substrate, a mask blank, a glass substrate, or a flat panel. In still other embodiments, the DW exposure system further includes a plurality of optic fibers for transporting the instructions generated by the data processing unit to the exposure unit, the instructions being transported by light signals, a converter for converting the light signals into corresponding electrical signals, and a switching circuit for receiving the electrical signals and distributing the electrical signals to the beam controller. In yet other embodiments, an encoder for encoding the instructions for transport by the plurality of optic fibers, and a decoder for decoding the encoded instructions for input to the switching circuit.

Also provided is a method for direct-writing to a substrate which includes providing a substrate having a recording medium formed thereon, generating instructions associated with a pattern to be formed over the substrate, scanning the substrate along an axis, providing a plurality of beams that covers a width that is larger than a width of a field size of an exposure system, the widths being in a direction different from the axis, and controlling the plurality of beams in accordance with the instructions while the substrate is being scanned along the axis such that the recording medium is exposed with the plurality of beams. In some embodiments, the plurality of beams substantially cover the width of the substrate. In some other embodiments, the step of scanning is performed in one direction along the axis to expose the entire substrate. In other embodiments, the plurality of beams cover about one-half of the width of the substrate.

In still other embodiments, the field size includes a maximum exposure area that a lens can properly project an image from a photomask to the substrate in a projection imaging system. In yet other embodiments, the instructions include a set of inter-field beam blanking instructions, the method further includes distributing the set of inter-field beam blanking instructions in parallel to at least two fields, where the step of controlling the plurality of beams includes controlling a first portion of the plurality of beams with the set of instructions to write the pattern to the one of the at least two fields and controlling a second portion of the plurality of beams with the same set of instructions to write the pattern to the other one of the at least two fields. In other embodiments, the instructions include intra-field beam blanking instructions, the method further includes encoding the intra-field beam blanking instructions for sharing with a plurality of optic fibers, and decoding the encoded instructions to be distributed to the plurality of beams to cover each of at least two fields, the at least two fields are simultaneously written with the pattern during the exposing.

Further, a direct-write (DW) scanning exposure apparatus which includes a stage for securing a substrate and capable of scanning the substrate, the substrate having a recording medium formed thereon, a data processing portion for generating beam blanking instructions associated with a pattern to be formed over the substrate, a multi-beam portion that is focused onto the recording medium, a beam blanking portion for controlling the multi-beam portion in accordance with the beam blanking instructions while the substrate is being scanned, and a plurality of carriers for carrying the beam blanking instructions from the data processing unit to the beam blanking portion. The beam blanking instructions are sent in parallel such that at least two fields are simultaneously written to the recording medium by the multi-beam portion to form the pattern in the at least two fields. In some embodiments, the DW scanning exposure apparatus further includes an encoder for encoding the beam blanking instructions for transport by the carriers, and a decoder for decoding the encoded beam blanking instructions on the carriers. In some other embodiments, the encoded instructions includes intra-field beam blanking instructions. In still other embodiments, the plurality of carriers include a plurality of optic fibers.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

The filed size may be the maximum area that a lens can satisfactorily image a pattern from a photomask to a wafer. The field size is usually used for projection imaging systems. For multi-beam tools, the beams can be imaged by a single lens or multiple lenses. The single lens is similar to projection imaging systems. Each lens in the multiple lens assembly has a much smaller field size than that of the entire lens assembly. Extending the field size of the lens assembly beyond the projection imaging field size is accomplished by the embodiments disclosed herein. Accordingly, the field size as used herein, unless otherwise specified, represents the limited field size of projection imaging systems to expose less critical layers that the multi-beam systems have to match when exposing critical layers. A die is an assembly of chips that is repeated over the area of the entire wafer. It is preferred to assemble as many chips as possible into a die to minimize the steps required to cover the exposure of the entire wafer, and thus maximize wafer throughput. A chip is an independently functioning circuit.

What is claimed is:

1. A direct-write (DW) exposure system, comprising:
    a stage for holding a substrate and configured to scan the substrate along an axis during exposure;
    a data processing module for processing patterning data and generating instructions associated with the patterning data; and
    an exposure module that includes:
        a plurality of beams that are focused onto the substrate such that the beams cover a width that is larger than a width of a field size of the exposure system, the widths being in a direction different from the axis; and
        a beam controller that controls the plurality of beams in accordance with the instructions while the substrate is scanned along the axis.

2. The system of claim 1, wherein the field size includes a maximum exposure area that a lens can properly project an image from a photomask to the substrate in a projection imaging system.

3. The system of claim 2, wherein the width of the field size is about 26 mm.

4. The system of claim 1, wherein the beams substantially cover the width of the substrate.

5. The system of claim 1, wherein the beams cover about one-half of the width of the substrate.

6. The system of claim 1, wherein the plurality of beams are each of a type selected from the group consisting of: an electron beam, an ion beam, and a photon beam.

7. The system of claim 1, wherein the substrate includes a recording medium formed thereon.

8. The system of claim 1, further comprising:
    a plurality of optic fibers for transporting the instructions generated by the data processing unit to the exposure unit, the instructions being transported by light signals;
    a converter for converting the light signals into corresponding electrical signals; and
    a switching circuit for receiving the electrical signals and distributing the electrical signals to the beam controller.

9. The system of claim 8, further comprising:
    an encoder for encoding the instructions for transport by the plurality of optic fibers; and
    a decoder for decoding the encoded instructions for input to the switching circuit.

10. A method for direct-writing to a substrate, the method comprising:
    providing a substrate having a recording medium formed thereon;
    generating instructions associated with a pattern to be formed over the substrate;
    scanning the substrate along an axis;
    providing a plurality of beams that covers a width that is larger than a width of a field size of an exposure system, the widths being in a direction different from the axis; and controlling the plurality of beams in accordance with the instructions while the substrate is being scanned along the axis such that the recording medium is exposed with the plurality of beams.

11. The method of claim 10, wherein the plurality of beams substantially cover the width of the substrate.

12. The method of claim 11, wherein the scanning is performed in one direction along the axis to expose the entire substrate.

13. The method of claim 10, wherein the plurality of beams cover about one-half of the width of the substrate.

14. The method of claim 10, wherein the field size includes a maximum exposure area that a lens can properly project an image from a photomask to the substrate in a projection imaging system.

15. The method of claim 10,
wherein the instructions include a set of inter-field beam blanking instructions;
including distributing the set of inter-field beam blanking instructions in parallel to at least two fields;
wherein the controlling the plurality of beams includes controlling a first portion of the plurality of beams with the set of instructions to write the pattern to the one of the at least two fields and controlling a second portion of the plurality of beams with the same set of instructions to write the pattern to the other one of the at least two fields.

16. The method of claim 10,
wherein the instructions include intra-field beam blanking instructions;
including encoding the intra-field beam blanking instructions for sharing with a plurality of optic fibers; and
including decoding the encoded instructions to be distributed to the plurality of beams to cover each of at least two fields, the at least two fields are simultaneously written with the pattern during the exposing.

17. A direct-write (DW) scanning exposure apparatus, the apparatus comprising:
a stage for securing a substrate and capable of scanning the substrate, the substrate having a recording medium formed thereon;
a data processing portion for generating beam blanking instructions associated with a pattern to be formed over the substrate;
an encoder for encoding the beam blanking instructions;
a multi-beam portion for emitting a plurality of beams focused onto the recording medium and simultaneously writing at least two fields to the recording medium to form the pattern in the at least two fields;
a beam blanking portion for controlling the multi-beam portion in accordance with the beam blanking instructions while the substrate is being scanned;
a plurality of carriers for receiving the encoded beam blanking instructions from the data processing unit and transmitting the encoded beam blanking instructions in parallel to the beam blanking portion; and
a decoder for decoding the encoded beam blanking instructions.

18. The apparatus of claim 17, further comprising: wherein a number of the plurality of carriers is less than a number of the plurality of beams.

19. The apparatus of claim 17, wherein the decoder comprises at least one light-to-electric signal converter.

20. The apparatus of claim 17, wherein the plurality of carriers include a plurality of optic fibers.

* * * * *